(12) United States Patent
Park et al.

(10) Patent No.: US 10,910,426 B2
(45) Date of Patent: Feb. 2, 2021

(54) SEMICONDUCTOR DEVICES HAVING PAD ISOLATION PATTERN

(71) Applicant: SAMSUNG ELECTRONICS CO., LTD., Suwon-si (KR)

(72) Inventors: Byungjun Park, Suwon-si (KR); Jinju Jeon, Suwon-si (KR); Younghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/580,024

(22) Filed: Sep. 24, 2019

(65) Prior Publication Data

US 2020/0350354 A1 Nov. 5, 2020

(30) Foreign Application Priority Data

May 3, 2019 (KR) .......................... 10-2019-0052311

(51) Int. Cl.
*H01L 27/146* (2006.01)
(52) U.S. Cl.
CPC .. *H01L 27/14632* (2013.01); *H01L 27/14621* (2013.01); *H01L 27/14627* (2013.01); *H01L 27/14636* (2013.01); *H01L 27/14645* (2013.01); *H01L 27/14687* (2013.01)
(58) Field of Classification Search
CPC ................................................ H01L 27/14632
USPC ............................................................ 257/292
See application file for complete search history.

(56) References Cited

U.S. PATENT DOCUMENTS

| 8,779,344 | B2 | 7/2014 | Kao |
| 9,608,024 | B2 | 3/2017 | Lee et al. |
| 10,014,285 | B2 | 7/2018 | Kim et al. |
| 10,109,665 | B2 | 10/2018 | Lee et al. |
| 2013/0323875 | A1 | 12/2013 | Park et al. |
| 2015/0348906 | A1* | 12/2015 | Park .................. H01L 33/486 257/774 |
| 2017/0040358 | A1 | 2/2017 | Kim et al. |

* cited by examiner

*Primary Examiner* — Ajay Arora
(74) *Attorney, Agent, or Firm* — F. Chau & Associates, LLC

(57) ABSTRACT

A semiconductor device is described which includes a substrate, an interlayer insulating layer provided below the substrate and including a via pad therein, a through via located at least partially within a via hole passing through the substrate and a portion of the interlayer insulating layer, a connection pad on the substrate, and a pad isolation pattern formed in the substrate to be located around the connection pad and the through via. The pad isolation pattern includes a plurality of bent portions having protrusions and recesses when viewed from a top view. As a result, cracks may be prevented from forming or growing in the semiconductor device.

21 Claims, 13 Drawing Sheets

SEMICONDUCTOR DEVICES HAVING PAD ISOLATION PATTERN

CROSS-REFERENCE TO RELATED APPLICATION

This application claims priority under 35 U.S.C. 119 to Korean Patent Application No. 10-2019-0052311, filed on May 3, 2019, the disclosure of which is incorporated herein by reference in its entirety.

BACKGROUND

1. Field

The inventive concept relates to a semiconductor device having a pad isolation pattern.

2. Description of Related Art

Mobile electronic devices such as tablet computers and mobile phones have become widely used around the word. Many of these electronic devices use one or more semiconductor devices. The mass production of semiconductor devices has resulted in many refinements in the manufacturing process in order to meet business requirements and consumer demand requirements. For example, circuit patterns for use in semiconductor devices are also becoming finer in accordance with the demand for small and light-weight semiconductor devices.

An image sensor is a semiconductor device that converts an optical image into an electrical signal. Image sensors may include a plurality of pads to exchange electrical signals between a pixel array and an external device. A deep trench isolation (DTI) pattern may be used to prevent leakage current from pads. However, in some cases, the DTI pattern may result in cracks that can cause damage to the semiconductor device.

SUMMARY

Example embodiments of the inventive concept describe a semiconductor device with an isolation pattern configured to prevent cracks from emerging in the device.

According to example embodiments, a semiconductor device includes a substrate, an interlayer insulating layer below the substrate and comprising a via pad, a through via located at least partially within a via hole passing through the substrate and a portion of the interlayer insulating layer and connected to the via pad, a connection pad on the substrate and electrically connected to the through via, and a pad isolation pattern formed in the substrate, around the connection pad and the through via. The pad isolation pattern includes a plurality of bent portions having protrusions and recesses in a top view.

According to example embodiments, a semiconductor device includes a first connection pad and a second connection pad, first through vias located adjacent to the first connection pad and second through vias located adjacent to the second connection pad, a first pad isolation pattern surrounding the first connection pad and the first through vias in a frame shape; and a second pad isolation pattern surrounding the second connection pad and the second through vias in the frame shape. In a top view, the first pad isolation pattern includes a plurality of first bent portions having protrusions and recesses and the second pad isolation pattern includes a plurality of second bent portions having protrusions and recesses.

According to example embodiments, a semiconductor device includes a lower substrate, a lower interlayer insulating layer provided on the lower substrate and comprising a lower via pad therein, an upper interlayer insulating layer provided on the lower interlayer insulating layer and comprising an upper via pad therein, an upper substrate on the upper interlayer insulating layer, a through via located at least partially within a via hole passing through the upper substrate and a portion of the upper interlayer insulating layer and connected to the lower via pad, a connection pad provided in a trench formed in an upper portion of the upper substrate and electrically connected to the through via, a pad isolation pattern passing through the upper substrate and surrounding the connection pad and the through via, a photodiode in the upper substrate, a color filter on the photodiode, and a microlens on the color filter. The pad isolation pattern includes a plurality of bent portions having protrusions and recesses in a top view.

According to another example embodiment, a semiconductor device comprises a substrate, an interlayer insulating layer below the substrate in a vertical direction, a plurality of via pads located within the interlayer insulating layer, a plurality of through vias, wherein each of the through vias is connected to one of the plurality of via pads and at least a portion of each of the through vias is located in a via hole passing through at least a portion of the interlayer insulating layer, a connection pad on the substrate and electrically connected to the through via, a pad isolation pattern formed in the substrate, wherein the pad isolation pattern surrounds the connection pad on four sides in a horizontal plane perpendicular to the vertical direction, and wherein the pad isolation pattern comprises a plurality of bent portions forming a plurality of protrusions and recesses in the horizontal plane on at least one of the four sides.

BRIEF DESCRIPTION OF THE DRAWINGS

The above and other objects, features, and advantages of the inventive concept will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
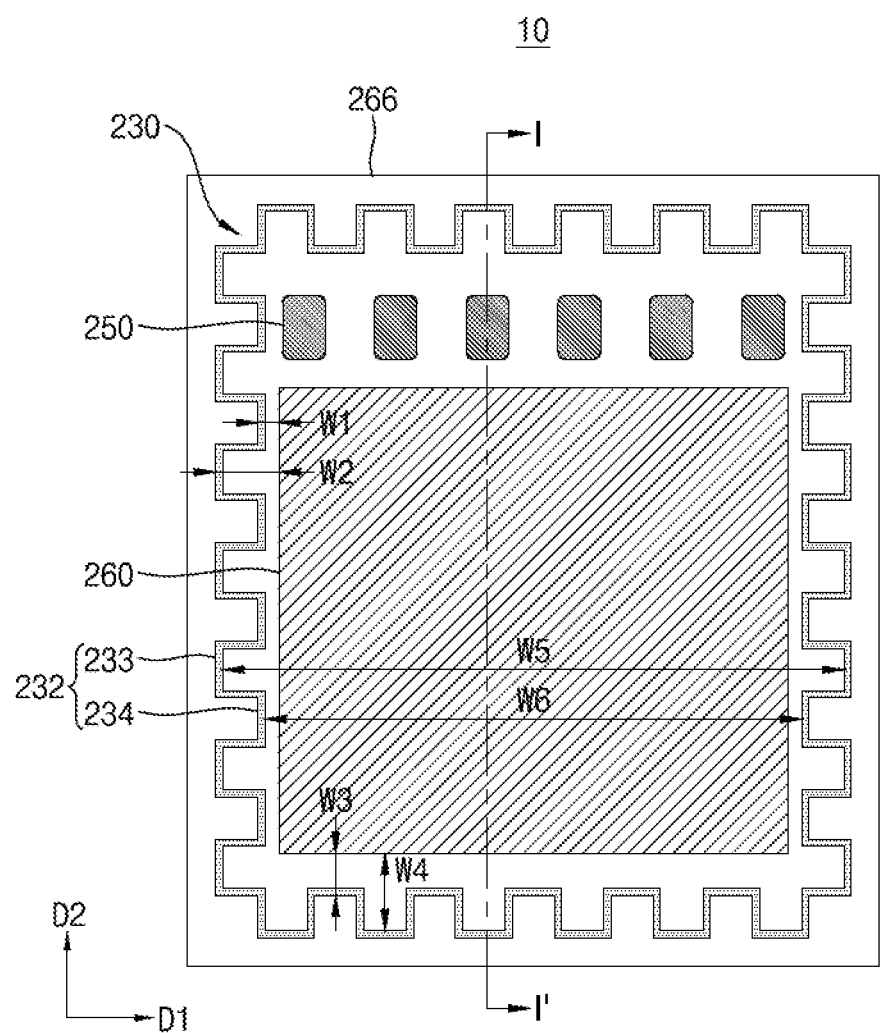
FIG. 1 is a plan view of a semiconductor device according to an embodiment of the inventive concept.
Figure 2:
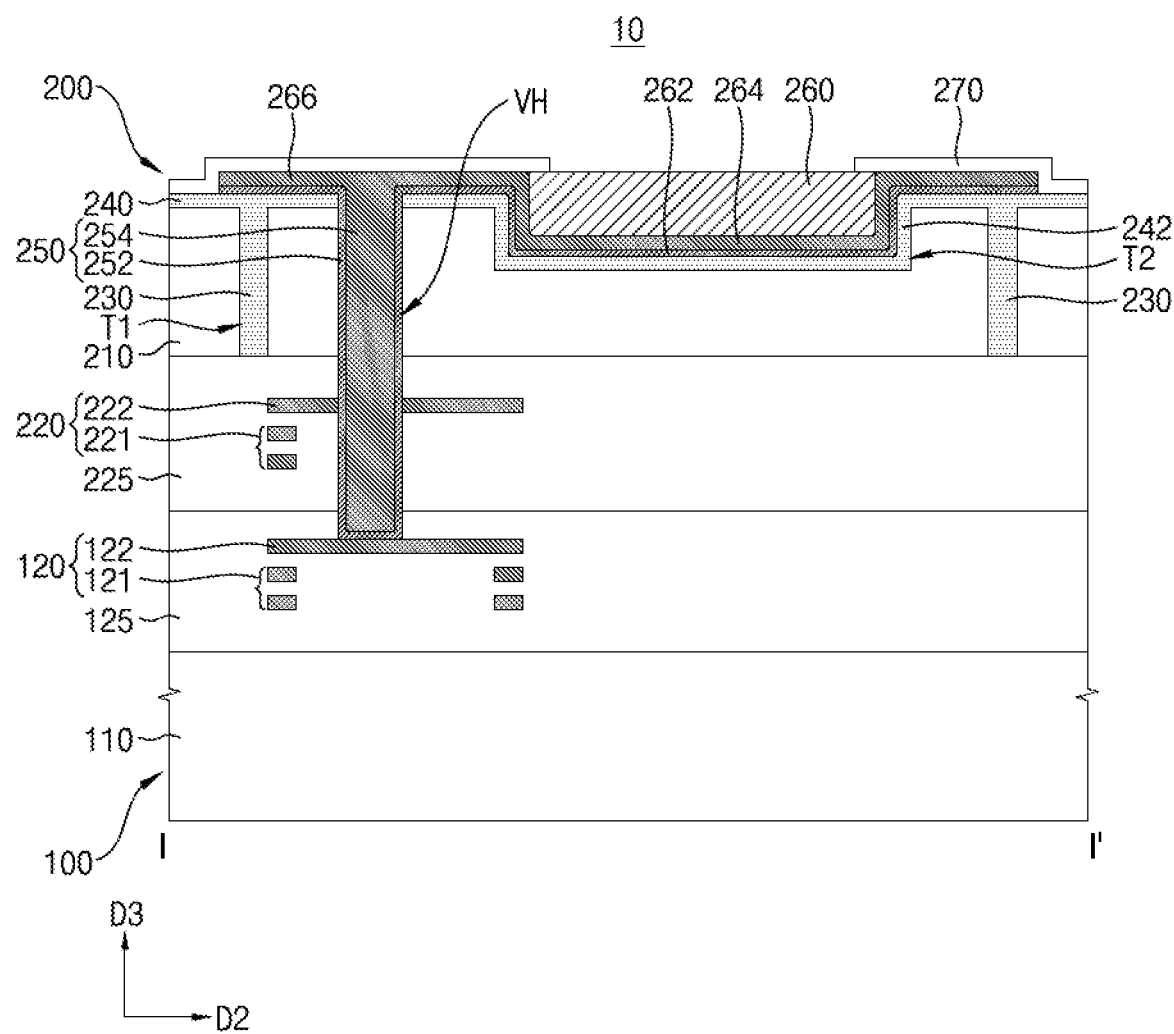
FIG. 2 is a vertical cross-sectional view of the semiconductor device of FIG. 1, taken along line I-I.

FIG. 1 is a plan view of a semiconductor device according to an embodiment of the inventive concept. FIG. 2 is a vertical cross-sectional view of the semiconductor device of FIG. 1, taken along line I-I.

Referring to FIGS. 1 and 2, a semiconductor device 10 may include a lower element 100 and an upper element 200 stacked on the lower element 100.

The lower element 100 may include a lower substrate 110, a lower circuit 120, and a lower interlayer insulating layer 125. The lower substrate 110 may include a semiconductor material. For example, the lower substrate 110 may be a silicon substrate, a germanium substrate, a silicon germanium substrate, or a silicon-on insulator (SOI) substrate.

The lower circuit 120 may be provided on the lower substrate 110 and included in the lower interlayer insulating layer 125. The lower circuit 120 may include a lower interconnection 121 and a lower via pad 122. The lower interconnection 121 may include a plurality of layers. The lower via pad 122 may be electrically connected to the lower interconnection 121. The lower interconnection 121 and the lower via pad 122 may include a metal such as tungsten, aluminum, or copper, a metal silicide such as tungsten silicide or titanium silicide, or a metal compound such as tungsten nitride or titanium nitride.

The lower interlayer insulating layer 125 may be provided on the lower substrate 110. The lower interlayer insulating layer 125 may include the lower circuit 120 therein. In one embodiment, the lower interlayer insulating layer 125 may include silicon oxide, silicon nitride, silicon oxynitride, tetraethyl orthosilicate (TEOS), flowable oxide (FOX), undoped silicate glass (USG), borosilica glass (BSG), or a low-K dielectric material.

The upper element 200 may be stacked on the lower element 100. The upper element 200 may include an upper substrate 210, an upper circuit 220, and an upper interlayer insulating layer 225. The upper element 200 may further include a pad isolation pattern 230, a capping insulating layer 240, a through via 250, a connection pad 260, and a passivation layer 270. The upper substrate 210 may be provided on the upper interlayer insulating layer 225. The upper substrate 210 may include the same material as the lower substrate 110.

The upper circuit 220 may include an upper interconnection 221 and an upper via pad 222. The upper interconnection 221 may include a plurality of layers. The upper via pad 222 may be electrically connected to the upper interconnection 221. The upper interconnection 221 and the upper via pad 222 may include the same material as the lower interconnection 121 and the lower via pad 122.

The upper interlayer insulating layer 225 may be provided below the upper substrate 210. The upper interlayer insulating layer 225 may be in contact with the lower interlayer insulating layer 125. The upper interlayer insulating layer 225 may include the upper circuit 220 therein.

Referring to FIG. 1, the pad isolation pattern 230 may include a plurality of bent portions 232 when viewed from the top view. For example, the pad isolation pattern 230 may have a pattern protruding or recessed in a first direction D1 or a second direction D2. In one embodiment, each of the bent portions 232 of the pad isolation pattern 230 may include a protrusion 233 and a recess 234. The protrusion 233 may be relatively distant from the connection pad 260, and the recess 234 may be relatively close to the connection pad 260. For example, the distance to the connection pad 260 from the recess 234 of the bent portion 232 adjacent to the connection pad 260 in the first direction D1 is a first width W1, and the distance to the connection pad 260 from the protrusion 233 of the bent portion 232 adjacent the connection pad 260 in the first direction D1 is a second width W2.

The second width W2 may be greater than the first width W1. Similarly, the distance from the connection pad 260 to the recess 234 of the bent portion 232 adjacent to the connection pad 260 in the second direction D2 is a third width W3, and the distance to the connection pad 260 from the protrusion 233 of the bent portion 232 adjacent to the connection pad 260 in the second direction D2 is a fourth width W4. The fourth width W4 may be greater than the third width W3. As illustrated in FIG. 1, the pad isolation pattern 230 may have an angular concave-convex shape but is not limited thereto. In one embodiment, the pad isolation pattern 230 may have a different curved shape. The pad isolation pattern 230 includes the bent portions 232 and thus may have non-uniform internal diameters. For example, the distance between the protrusions 233 facing each other with respect to the connection pad 260 in the first direction D1 may be a fifth width W5, and the distance between the recesses 234 facing each other with respect to the connection pad 260 in the first direction D1 may be a sixth width W6. The sixth width W6 may be less than the fifth width W5.

The pad isolation pattern 230 may be formed to pass through the upper substrate 210. For example, a first trench T1 may be formed to pass through the upper substrate 210, and the pad isolation pattern 230 may be formed in the first trench T1. Additionally, the pad isolation pattern 230 may electrically insulate the connection pad 260 and the through via 250 from the upper substrate 210. The pad isolation pattern 230 may include silicon oxide, silicon nitride, silicon oxynitride, or a combination thereof and may have a frame shape surrounding the through via 250 and the connection pad 260.

Generally, a process of forming the semiconductor device 10 may include one or both of a sawing process and a mounting process performed on semiconductor chips manufactured on a wafer. In the sawing process and the mounting process, substantial stresses may cause cracks to form in the semiconductor device 10 (e.g., in a horizontal direction and along an insulating layer surrounding the connection pad 260). These cracks can cause the semiconductor device 10 to malfunction. By including a pad isolation pattern 230 with numerous bent portions, recesses, and protrusions, these stresses can be more effectively distrusted throughout the material surrounding the pad isolation pattern 230, which prevents the formation of cracks.

As illustrated in FIG. 1, the pad isolation pattern 230 of the semiconductor device 10 according to the embodiment of the inventive concept includes the bent portions 232 and thus cracks may be prevented from occurring in the semiconductor device 10 along the insulating layer.

The capping insulating layer 240 may be formed on the upper substrate 210. In one embodiment, the capping insulating layer 240 may be provided along an upper surface of the upper substrate 210. The capping insulating layer 240 may be materially continuous with the pad isolation pattern 230 and may include the same material as the pad isolation pattern 230.

A second trench T2 is formed in the upper substrate 210 and a pad insulating layer 242 may be provided along a second trench T2. The pad insulating layer 242 may be provided on an inner side surface and a bottom surface of the second trench T2. The pad insulation layer 242, pad isolation pattern 230, and the capping insulating layer 240 may include the same material, and may be materially continuous.

The through via 250 may be provided in a via hole VH formed in the upper substrate 210. The via hole VH may be provided from the upper surface of the upper substrate 210 to the lower interlayer insulating layer 125. In one embodiment, the through via 250 may perpendicularly pass through the upper substrate 210 and the upper interlayer insulating layer 225 and may perpendicularly pass through a portion of the lower interlayer insulating layer 125. The through via 250 may be in contact with the upper via pad 222 and the lower via pad 122. Although FIG. 2 illustrates the through via 250 has a rectangular cross-section, the through via 250 is not limited thereto. In one embodiment, the through via 250 may be tapered such that a width thereof is decreased in a direction from the upper surface of the upper substrate 210 to the bottom thereof.

The through via 250 may include a barrier layer 252 and a via core 254. The barrier layer 252 may be formed along an inner side surface and a bottom surface of the via hole VH. Some portions of the barrier layer 252 may extend to the capping insulating layer 240. The via core 254 may be provided on the barrier layer 252. The inside of the via hole VH may be completely filled with the via core 254. The barrier layer 252 may include W, WN, WC, Ti, TiN, Ta, TaN, Ru, Co, Mn, WN, Ni, or a combination thereof. The via core 254 may include Cu, CuSn, CuMg, CuNi, CuZn, CuPd, CuAu, CuW, W, or a combination thereof.

The connection pad 260 may be provided in the second trench formed in the upper substrate 210. A lower surface of the connection pad 260 may be at a level lower than the upper surface of the upper substrate 210. An upper surface of the connection pad 260 may be covered, in part or in whole, with the passivation layer 270. A barrier pattern 262 and a pad pattern 264 may be stacked on a bottom of the connection pad 260 and provided in the second trench T2. The barrier pattern 262 may be provided on the pad insulating layer 242 and may be materially continuous with the barrier layer 252. The pad pattern 264 may be provided on the barrier pattern 262 and may be materially continuous with the via core 254. In one embodiment, the connection pad 260 may include aluminum but is not limited thereto. The barrier pattern 262 and the pad pattern 264 may have respectively the same material as the barrier layer 252 and the via core 254.

A pad conductive layer 266 may be provided on the upper substrate 210. For example, the pad conductive layer 266 may be provided on the barrier layer 252 extending to an upper surface of the capping insulating layer 240. The pad conductive layer 266 may be materially continuous with the via core 254 and the pad pattern 264. The pad conductive layer 266 may physically and electrically connect the through via 250 and the connection pad 260. In one embodiment, the pad conductive layer 266 may cover the pad isolation pattern 230 and overlap the pad isolation pattern 230 in a third direction D3.

For example, when viewed from the top view, an outer circumference of the pad conductive layer 266 may be located outside the pad isolation pattern 230. In addition, the portions of the barrier layer 252 extending to the upper surface of the capping insulating layer 240 may overlap the pad isolation pattern 230 in the third direction D3. As illustrated in FIG. 2, the pad conductive layer 266 covers the pad isolation pattern 230 and thus may prevent cracks from occurring in the semiconductor device 10 along the pad isolation pattern 230.

The passivation layer 270 may be provided on the capping insulating layer 240 and the pad conductive layer 266. The passivation layer 270 may cover a portion of the connection pad 260 and may define a region in which an external terminal is to be formed on the connection pad 260. In addition, the passivation layer 270 may electrically insulate the through via 250 and the pad conductive layer 266 from the outside. The passivation layer 270 may include silicon nitride, silicon oxide, silicon oxynitride, polyimide, a polymeric organic material, or a combination thereof.

Thus, according to an example embodiment, the semiconductor device 10 comprises a substrate 210, an interlayer insulating layer 225 below the substrate 210 in a vertical direction (i.e., third direction D3), a plurality of via pads (i.e., lower via pads 122 or upper via pads 222) located within the interlayer insulating layer 225, a plurality of through vias 250, wherein each of the through vias 250 is connected to one of the plurality of via pads, and at least a portion of each of the through vias 250 is located in a via hole VH passing through at least a portion of the interlayer insulating layer 225, a connection pad 260 on the substrate and electrically connected to the through vias 250, and a pad isolation pattern 230 formed in the substrate 210.

The pad isolation pattern 230 surrounds the connection pad 260 on plurality of sides (i.e., two three or four sides) in a horizontal plane perpendicular to the vertical direction, and wherein the pad isolation pattern 230 comprises a plurality of bent portions forming a plurality of protrusions and recesses in the horizontal plane on at least one of the sides. Thus, according to various embodiments, the pad isolation pattern 230 does not form a polygon patter. The bent portions of the pad isolation pattern 230 are configured to prevent cracks from emerging in the semiconductor device 10 (e.g., during a sawing or mounting process that puts the semiconductor device 10 under substantial stress).

FIGS. 3 to 6 are plan views of semiconductor devices according to embodiments of the inventive concept.

Figure 3:
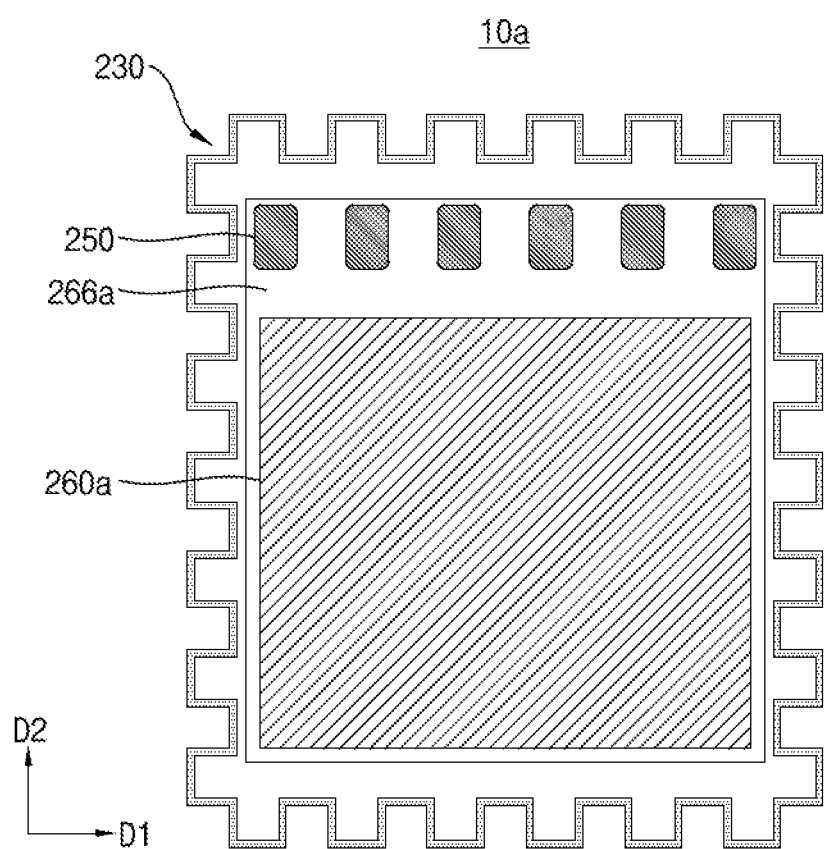
FIGS. 3 to 6 are plan views of semiconductor devices according to embodiments of the inventive concept.

Referring to FIG. 3, a semiconductor device 10a may include a connection pad 260a and a pad conductive layer 266a. The pad conductive layer 266a may cover a connection pad 260a and a through via 250. However, the pad conductive layer 266a may not cover a pad isolation pattern 230. For example, an outer circumference of the pad conductive layer 266a may be located inside the pad isolation pattern 230. In one embodiment, the connection pad 260a and the pad conductive layer 266a may be respectively smaller in size than the connection pad 260 and the pad conductive layer 266. In one embodiment, the pad conductive layer 266a may be overlapped with pad isolation pattern 230. For example, the outer circumference of the pad conductive layer 266a may be located inside a protrusion 233 of the pad isolation pattern 230 and at an outer side of a recess 234 of the pad isolation pattern 230.

Figure 4:
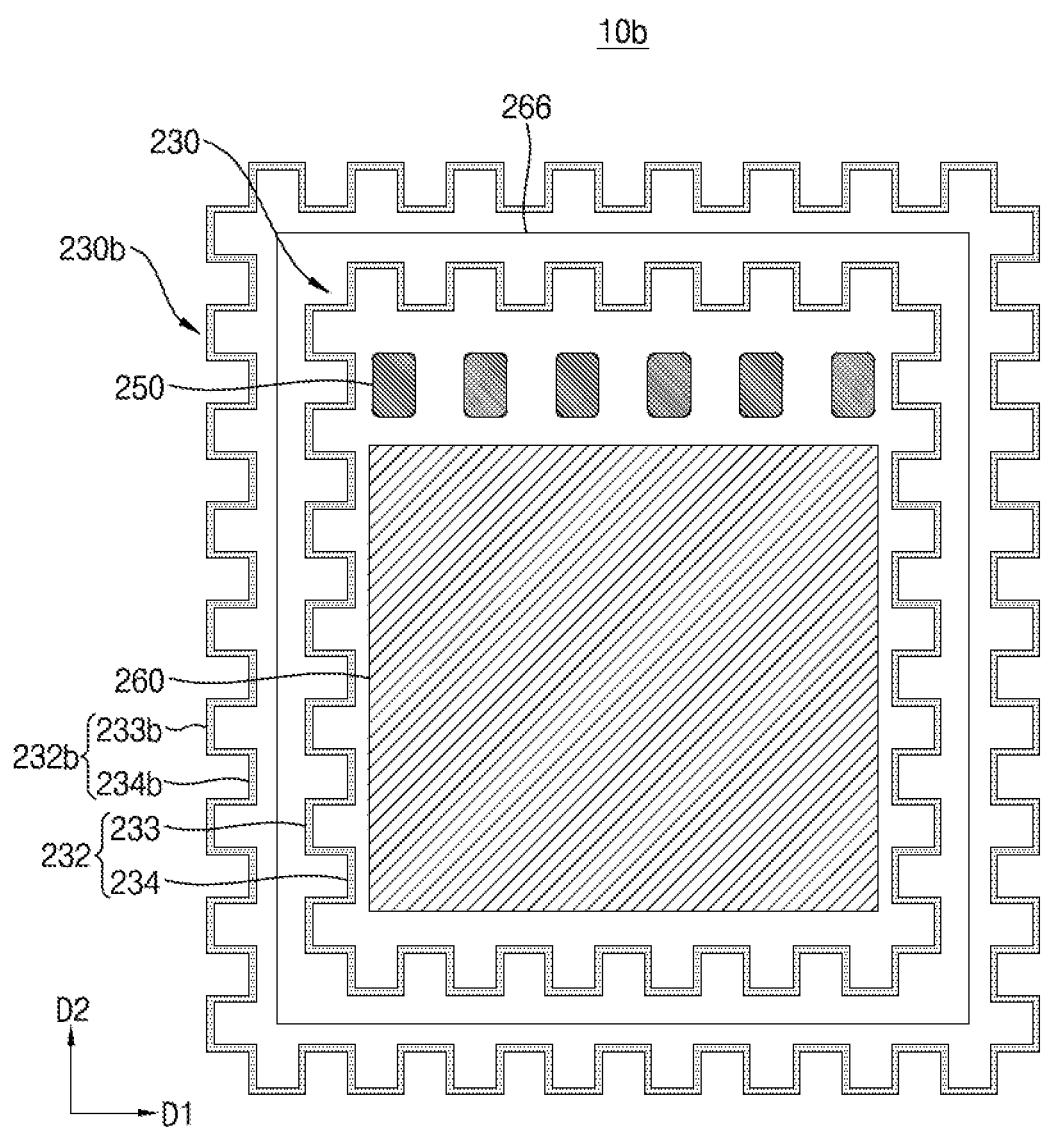

Referring to FIG. 4, a semiconductor device 10b may further include an outer isolation pattern 230b. The outer isolation pattern 230b may be provided at an outer side of a pad isolation pattern 230. When viewed from a top view, the outer isolation pattern 230b may include a plurality of bent portions 232b. The outer isolation pattern 230b may surround the pad isolation pattern 230. Each of the bent portions 232b may include a protrusion 233b and a recess 234b. In one embodiment, a width from a connection pad 260 to the protrusion 233b adjacent thereto in the first direction D1 may be greater than that from the connection pad 260 to the recess 234b adjacent thereto in the first direction D1. The bent portions 232b of the outer isolation pattern 230b may be thrilled in a pattern similar to the pad isolation pattern 230, and the outer isolation pattern 230b may include the same material as the pad isolation pattern 230. FIG. 4 illustrates that the bent portions 232b of the outer isolation pattern 230b and bent portions 232 of the pad isolation pattern 230 are formed in the same size but the embodiments are not limited thereto. In one embodiment, the outer isolation pattern 230b may be provided at an outer side of the pad conductive layer 266. In one embodiment, the outer isolation pattern 230b may be provided at an inner side of the pad conductive layer 266. Alternatively, the outer isolation pattern 230b may be overlapped with the pad conductive layer 266.

As illustrated in FIG. 4, the semiconductor device 10b includes a pad isolation pattern 230 surrounding the connection pad 260 and the outer isolation pattern 230b surrounding the pad isolation pattern 230. The configuration of the outer isolation pattern 230b and the pad isolation pattern 230 may prevent cracks from occurring in the semiconductor device 10b. In one embodiment, the outer isolation pattern 230b may be formed to be a different thickness than the pad isolation pattern 230.

Figure 5:
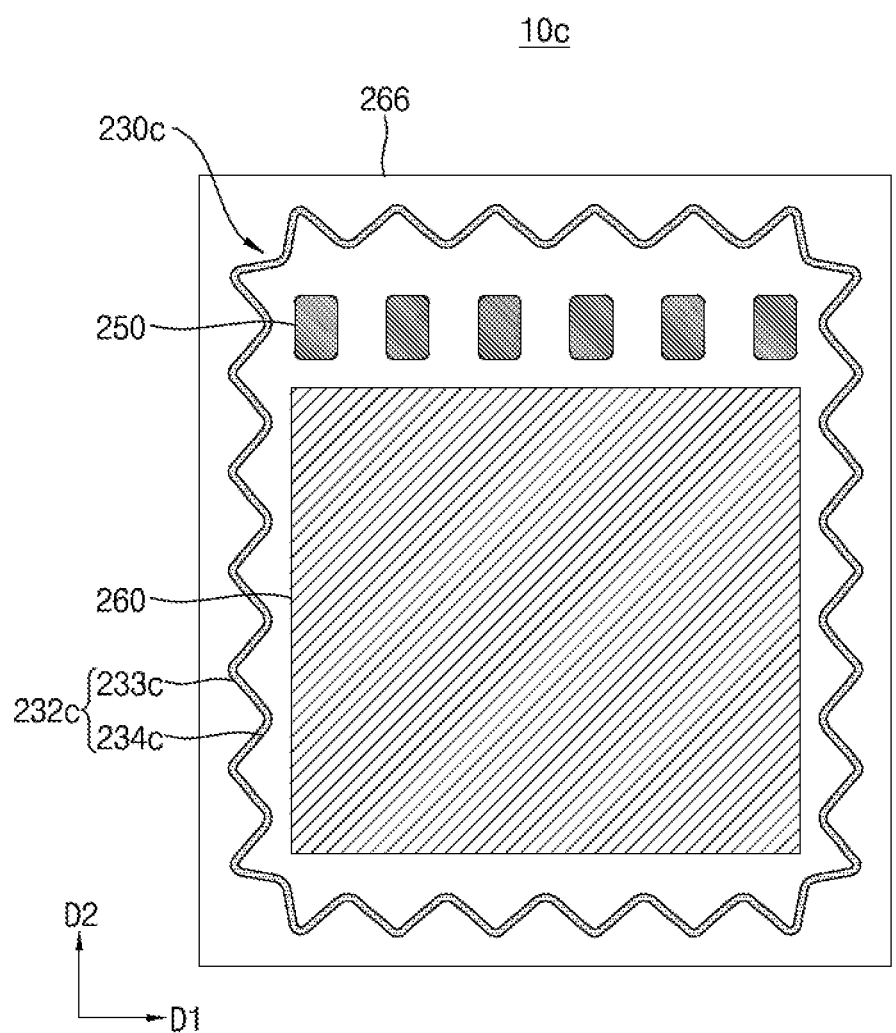

Referring to FIG. 5, a semiconductor device 10c may include a pad isolation pattern 230c. When viewed from a top view, the pad isolation pattern 230c may include a plurality of bent portions 232c. Each of the bent portions 232c may include a protrusion 233c and a recess 234c. Each of the bent portions 232c of the pad isolation pattern 230c may have a round shape. For example, the bent portions 232c of the pad isolation pattern 230c may have a wave pattern but are not limited to a single pattern.

Figure 6:
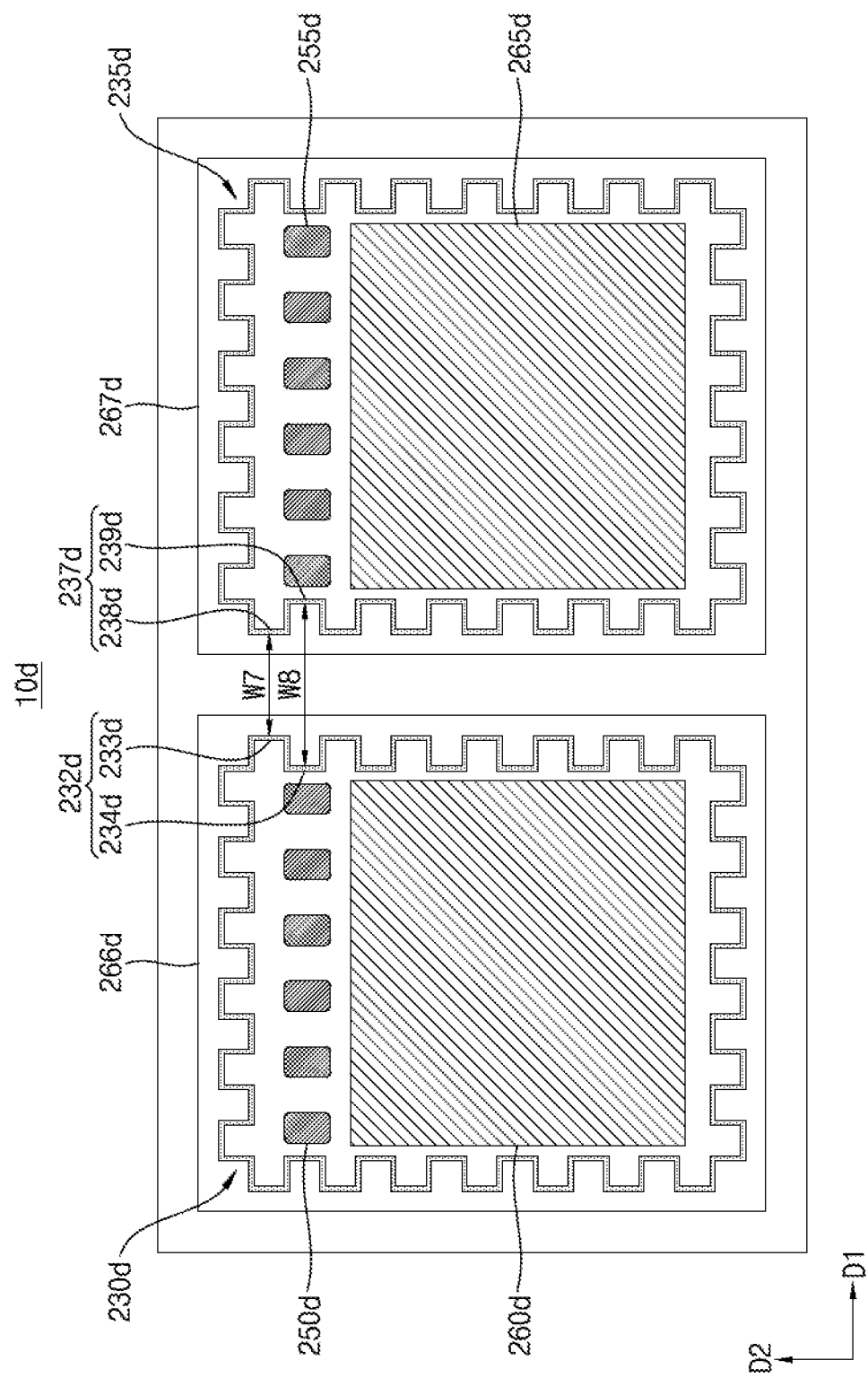

Referring to FIG. 6, a semiconductor device 10d may include a first pad isolation pattern 230d, a second pad isolation pattern 235d, a first through via 250d, a second through via 255d, a first connection pad 260d, a second connection pad 265d, a first pad conductive layer 266d, and a second pad conductive layer 267d.

The first connection pad 260d and the second connection pad 265d may be provided to be spaced apart from each other. The first connection pad 260d and the second connection pad 265d may be connected to different external terminals (not shown). A plurality of first through vias 250d may be provided close to the first connection pad 260d. The first pad isolation pattern 230d may be provided in a frame shape surrounding the first through via 250d and the first connection pad 260d. The first pad conductive layer 266d may cover the first pad isolation pattern 230d. For example, an outer circumference of the first pad conductive layer 266d may be located at an outer side of the first pad isolation pattern 230d.

The second pad isolation pattern 235d, the second through via 255d, the second connection pad 265d and the second pad conductive layer 267d may respectively have identical or similar structures to the first pad isolation pattern 230d, the first through via 250d, the first connection pad 260d, and the first pad conductive layer 266d.

When viewed from a top view, the first pad isolation pattern 230d may include a plurality of bent portions 232d, and the second pad isolation pattern 235d may include a plurality of bent portions 237d. Each of the bent portions 232d may include a protrusion 233d and a recess 234d. Each of the bent portions 237d may include a protrusion 238d and a recess 239d.

In one embodiment, the bent portions 232d of the first pad isolation pattern 230d and the bent portions 237d of the second pad isolation pattern 235d may be formed having the same size. The distance between the first pad isolation pattern 230d and the second pad isolation pattern 235d may not be uniform. For example, the distances between the protrusions 233d of the first pad isolation pattern 230d and the protrusions 238d of the second pad isolation pattern 235d which face each other in the first direction D1 may be a seventh width W7. The distances between the recesses 234d of the first pad isolation pattern 230d and the recesses 239d of the second pad isolation pattern 235d in the first direction D1 may be an eighth width W8. The eighth width W8 may be greater than the seventh width W7.

FIGS. 7 to 11 are vertical cross-sectional views illustrating in a process order of a method of manufacturing a semiconductor device according to an embodiment of the inventive concept.

Figure 7:
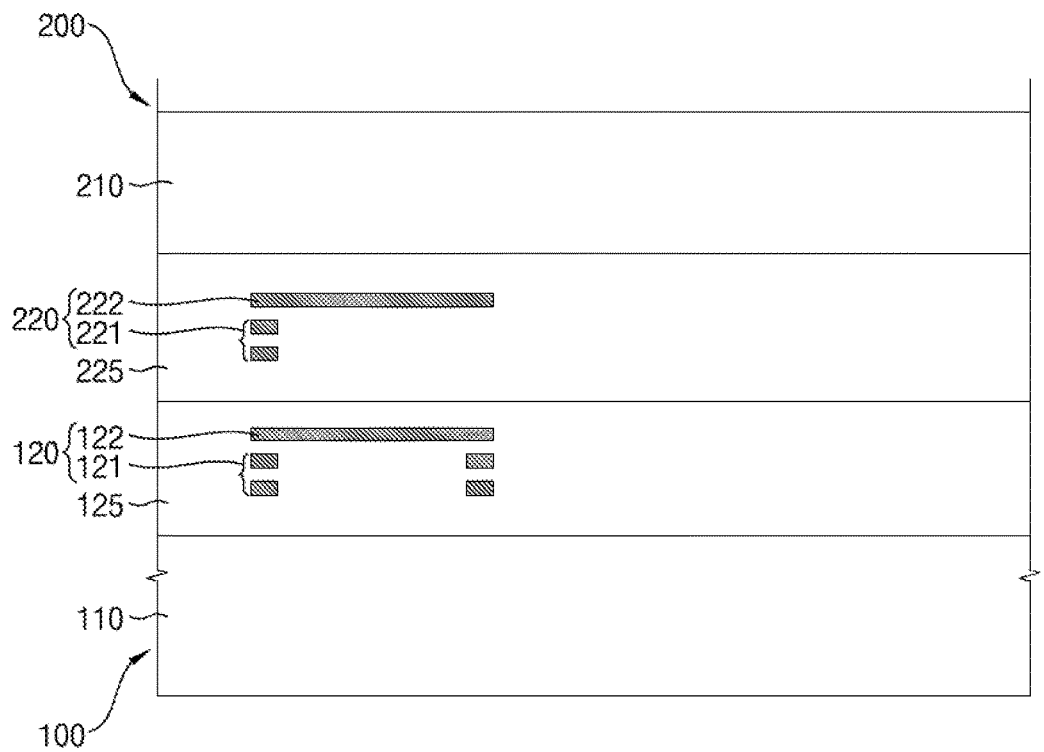
FIGS. 7 to 11 are vertical cross-sectional views illustrating in a process order of a method of manufacturing a semiconductor device according to an embodiment of the inventive concept.

Referring to FIG. 7, a lower element 100 and an upper element 200 may be provided. The lower element 100 may include a lower substrate 110, a lower circuit 120, and a lower interlayer insulating layer 125. The lower substrate 110 may include a semiconductor material and may be, for example, a silicon substrate. The lower circuit 120 may be formed on the lower substrate 110 and may include a lower interconnection 121, consisting of a plurality of layers, and a lower via pad 122. The lower interconnection 121 and the lower via pad 122 may be formed by depositing and patterning an insulating material and performing a plating process thereon. The lower interlayer insulating layer 125 may cover the lower circuit 120 and be formed on the lower substrate 110. The lower interconnection 121 and the lower via pad 122 may include a metal such as tungsten, aluminum, and copper, a metal silicide such as tungsten silicide and titanium silicide, or a metal compound such as tungsten nitride and titanium nitride but are not limited thereto. The lower interlayer insulating layer 125 may include silicon oxide.

The upper element 200 may include an upper substrate 210, an upper circuit 220, and an upper interlayer insulating layer 225. The upper substrate 210 may include the same material as the lower substrate 110. The upper circuit 220 may be formed on one surface of the upper substrate 210. The upper circuit 220 may include an upper interconnection 221 and an upper via pad 222. The upper interlayer insulating layer 225 may cover the upper circuit 220 and be formed below the upper substrate 210. The upper interlayer insulating layer 225 may be provided to be in contact with the lower interlayer insulating layer 125. In one embodiment, after the upper circuit 220 and the upper interlayer insulating layer 225 are formed on one surface of the upper substrate 210, the upper element 200 and the lower element 100 may be bonded to each other such that the upper interlayer insulating layer 225 is in contact with the lower interlayer insulating layer 125. The upper substrate 210, the upper circuit 220, and the upper interlayer insulating layer 225 may respectively include the same material as the lower substrate 110, the lower circuit 120, and the lower interlayer insulating layer 125.

Figure 8:
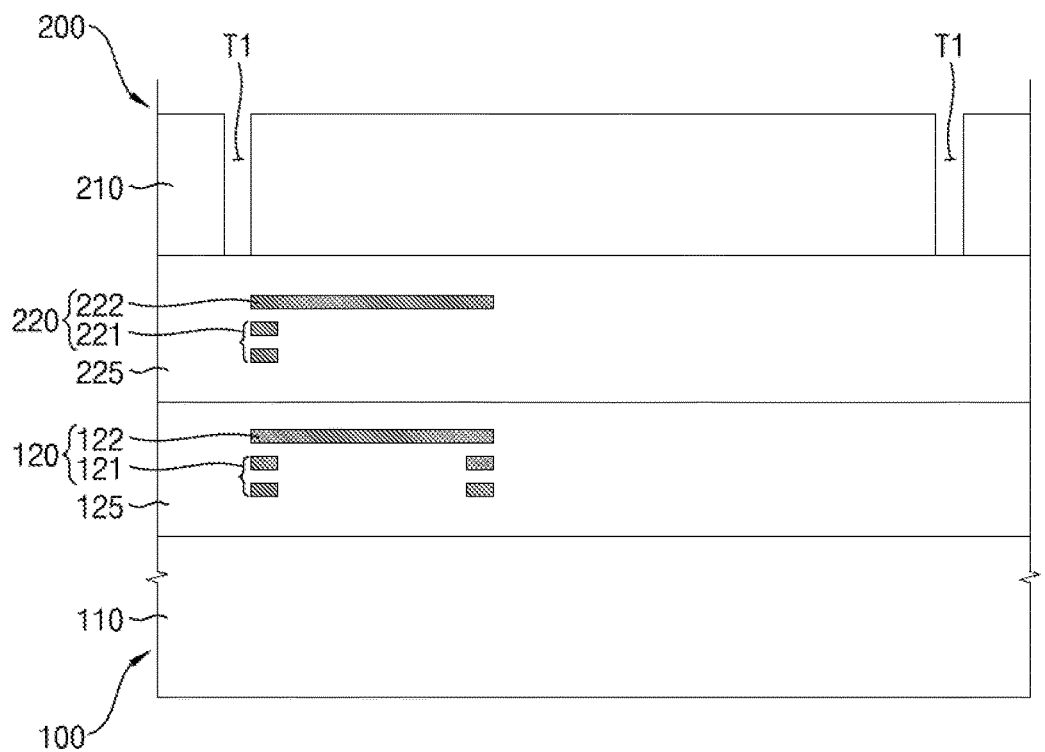

Referring to FIG. 8, as first trench T1 may be formed in the upper substrate 210. The first trench T1 may be formed by forming a mask pattern on the upper substrate 210 and performing an etching process thereon. The first trench T1 may be formed to completely pass through the upper substrate 210. The first trench T1 may define a region in which a pad isolation pattern 230 is to be formed.

Figure 9:
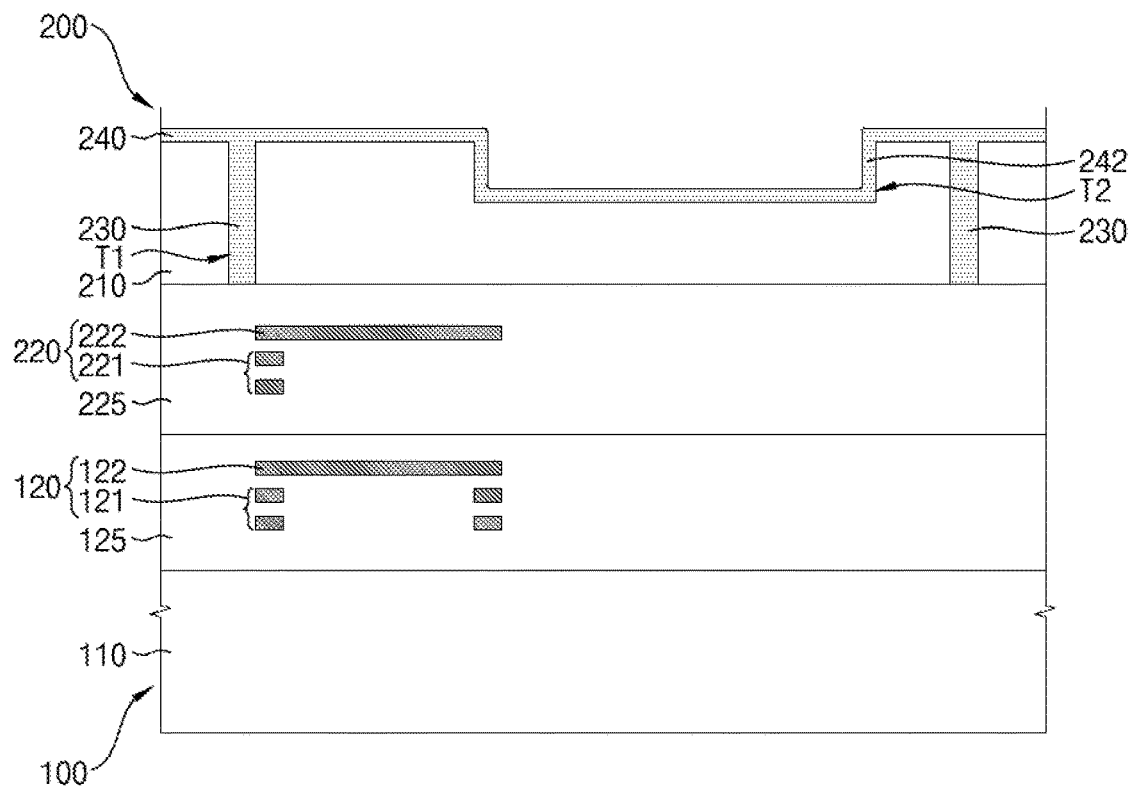

Referring to FIG. 9, the pad isolation pattern 230 may be formed in the first trench T1. The inside of the first trench T1 may be completely filled with the pad isolation pattern 230. In one embodiment, a seam may be formed in the pad isolation pattern 230.

The inside of the first trench T1 may be filled with an insulating material. The insulating material may be formed on the first trench T1 and the upper substrate 210 and a planarization process may be performed to form the pad isolation pattern 230. A second trench T2 may be formed by exposing the upper substrate 210 using the planarization process. The second trench T2 may be formed by partially etching the upper substrate 210 using a mask pattern. Thereafter, an insulating material may be deposited to form a capping insulating layer 240 and a pad insulating layer 242. The capping insulating layer 240 may be formed on an upper surface of the upper substrate 210. The pad insulating layer 242 may be formed along an inner side surface and a bottom surface of the second trench T2. The capping insulating layer 240 and the pad insulating layer 242 may be materially continuous with the pad isolation pattern 230. In one embodiment, the pad isolation pattern 230, the capping insulating layer 240 and the pad insulating layer 242 may include silicon oxide. The pad isolation pattern 230 may be formed by a process such as chemical vapor deposition (CND) or atomic layer deposition (ALD), but the process is not limited thereto.

Figure 10:
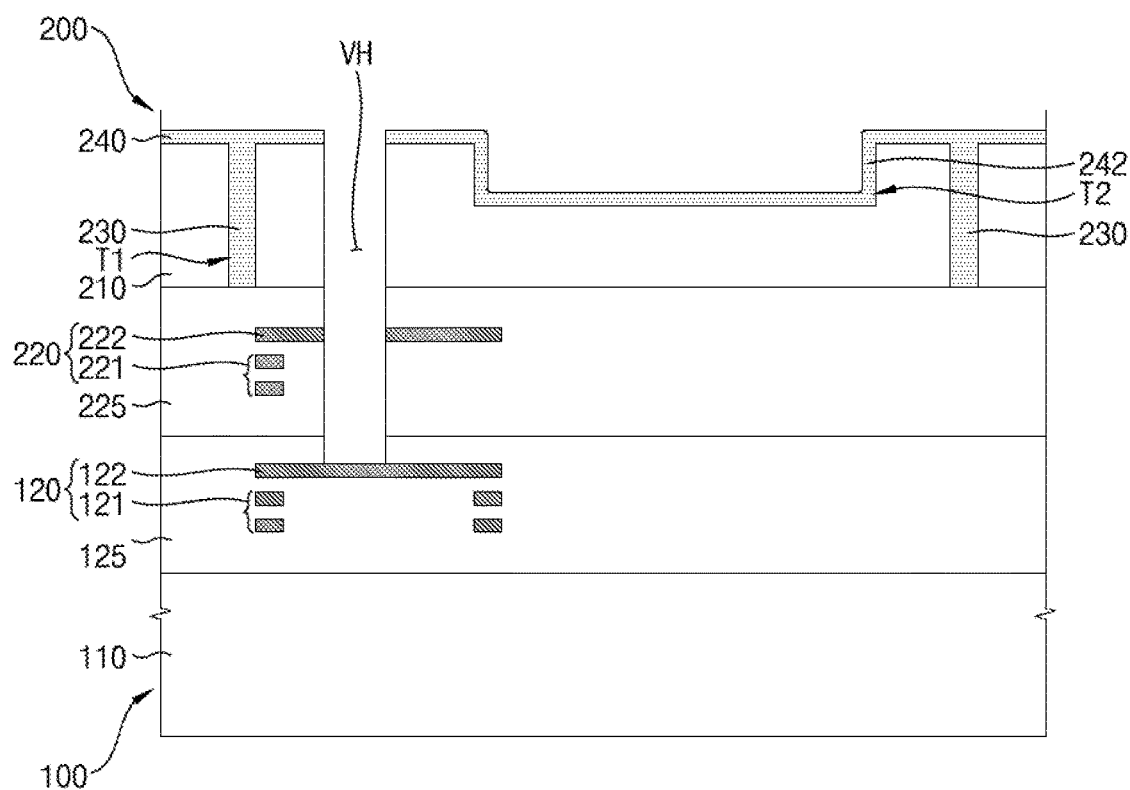

Referring to FIG. 10, a via hole VH may be formed in the upper substrate 210. The lower circuit 120 may be exposed via the via hole VH. For example, the via hole VH may be formed to completely pass through the upper substrate 210 and the upper interlayer insulating layer 225 and to pass through a portion of the lower interlayer insulating layer 125. Furthermore, the via hole VH may pass through the upper circuit 220. The via hole VH may define a region in which a through via 250 is to be formed. A horizontal width of the via hole VH may be greater than that of the first trench T1. The horizontal width of the via hole VH may be less than that of the second trench T2. In one embodiment, a plurality of via holes VH may be formed adjacent to the second trench T2.

Figure 11:
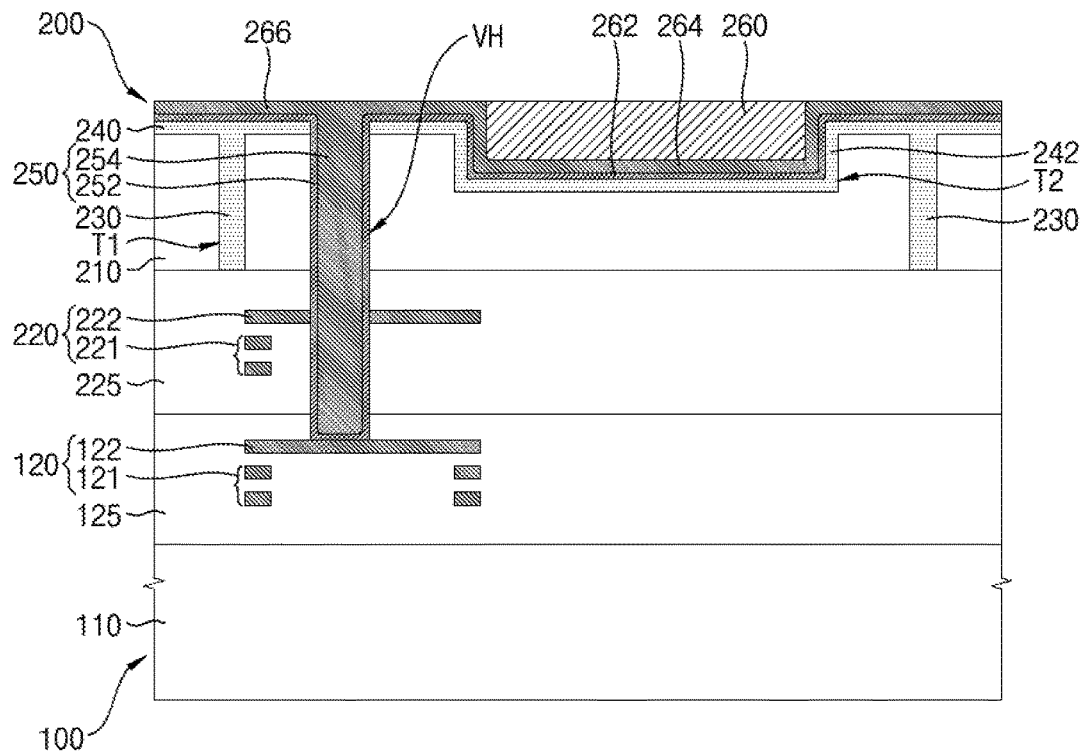

Referring to FIG. 11, the through via 250 and a connection pad 260 may be formed. The through via 250 may be formed in the via hole VH and include a barrier layer 252 and a via core 254. The barrier layer 252 may be thrilled along an inner side surface and a bottom surface of the via hole VH. The harrier layer 252 may be formed to partially extend to the upper substrate 210. The via core 254 may be formed on the barrier layer 252, and the remaining space of the via hole VH may be completely filled with the via core 254. The via core 254 may be formed to partially extent to the upper substrate 210. The barrier layer 252 may include W, WN, WC, Ti, Ta, TaN, Ru, Co, Mn, WN, Ni, or a combination thereof. The via core 254 may include Cu, CuSn, CuMg, CuNi, CuZn, CuPd, CuAu, CuW, W or a combination thereof.

The connection pad 260 may be formed in the second trench T2. The barrier pattern 262 and the pad pattern 264 may be stacked on the bottom of the connection pad 260. The barrier pattern 262 may be formed on the pad insulating layer 242 and may be materially continuous with the via core 254. The pad pattern 264 may be formed on the barrier pattern 262. The pad pattern 264 may be materially continuous with the via core 254. A pad conductive layer 266 may be formed on the upper substrate 210. For example, the pad conductive layer 266 may be formed on a surface of a portion of the barrier layer 252 provided on the capping insulating layer 240.

The pad conductive layer 266 may be materially continuous with the via core 254. The remaining space of the second trench T2 may be completely filled with the connection pad 260 after the harrier pattern 262 and the pad pattern 264 are formed. In one embodiment, the connection pad 260 may be formed by forming a conductive material on the pad pattern 264 and performing a planarization process thereon. An upper surface of the connection pad 260 may be at the same level as that of the pad conductive layer 266.

Referring back to FIG. 2, the passivation layer 270 may be formed on the resultant structure of FIG. 2. For example, the passivation layer 270 may cover the capping insulating layer 240 and the pad conductive layer 266. In addition, the passivation layer 270 may cover a portion of the connection pad 260. The passivation layer 270 may include silicon nitride, silicon oxide, silicon oxynitride, polyimide, a polymeric organic material, or a combination thereof.

Figure 12:
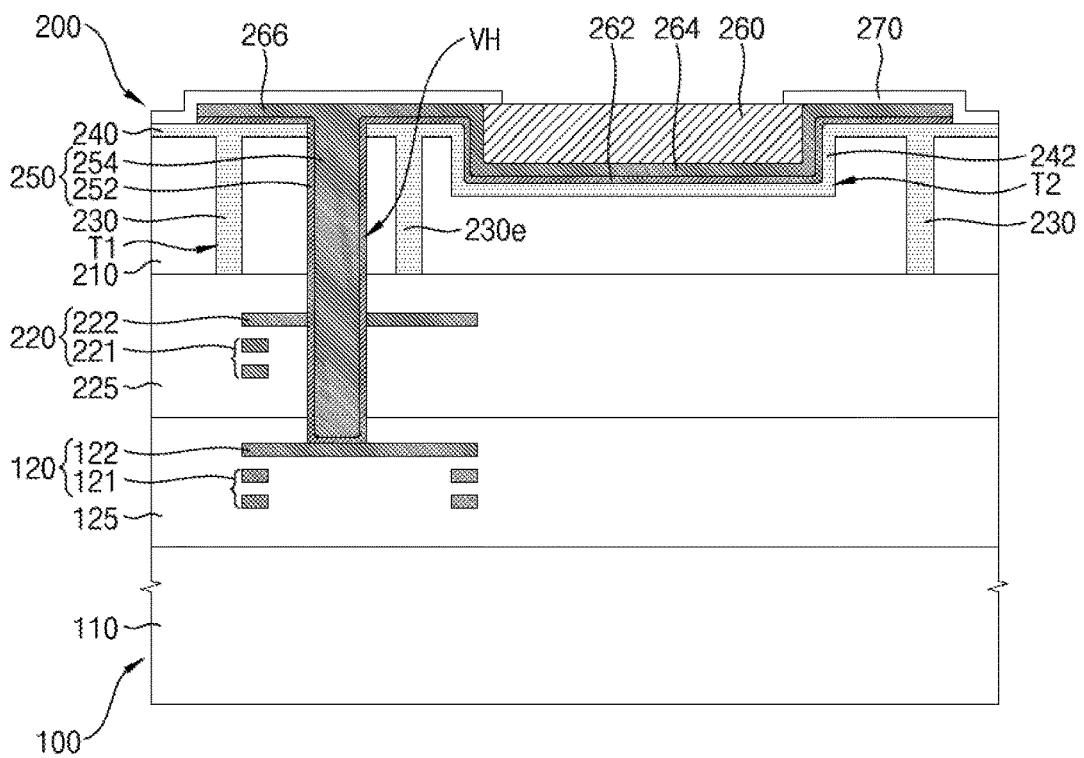
FIGS. 12 and 13 are cross-sectional views illustrating semiconductor device according to embodiments of the inventive concept.
Figure 13:
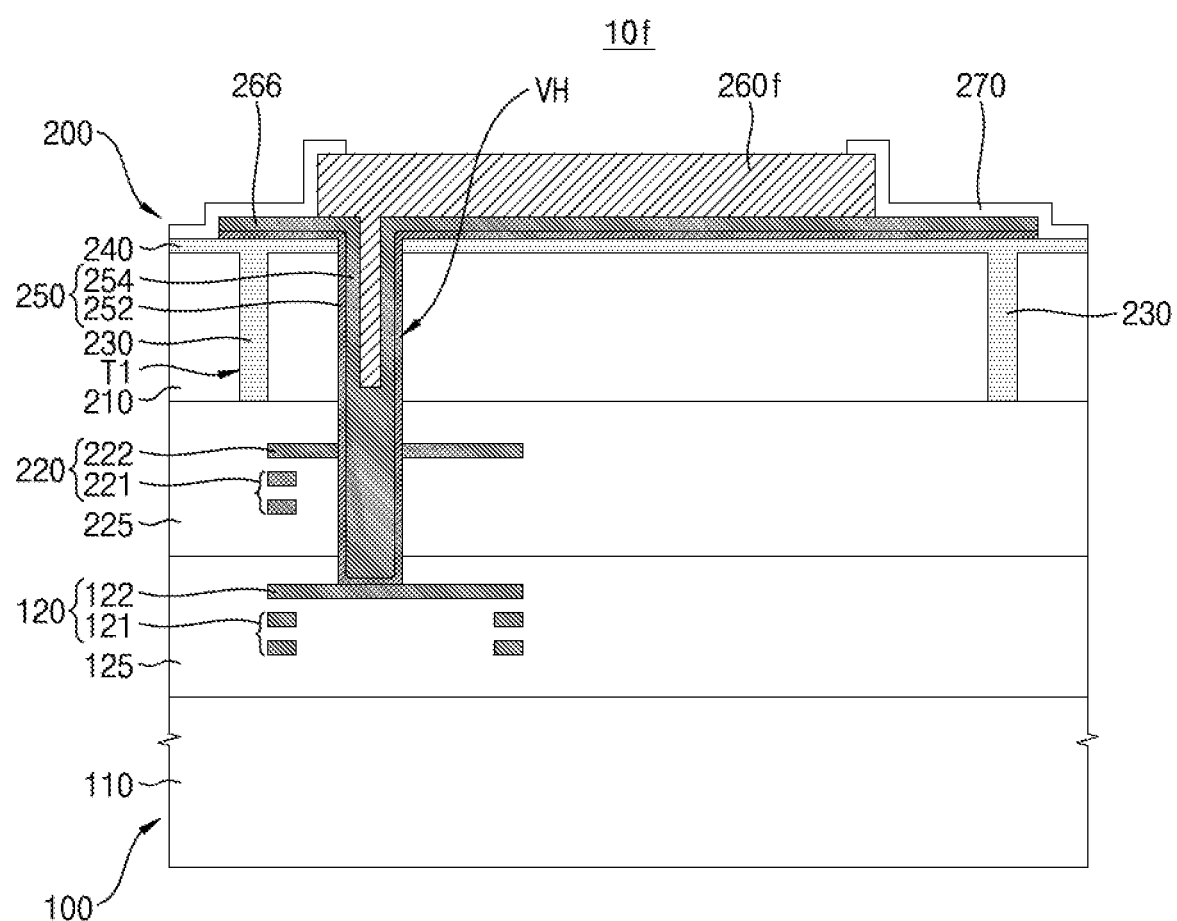

FIGS. 12 and 13 are cross-sectional views illustrating semiconductor device according to embodiments of the inventive concept.

Referring to FIG. 12, a via isolation pattern 230e may be included in an upper substrate 210 of a semiconductor device 10e. The via isolation pattern 230e may be formed to pass through the upper substrate 210. The via isolation pattern 230c may include the same material as the pad isolation pattern 230. The via isolation pattern 230e may be provided between the through via 250 and the connection pad 260. The via isolation pattern 230e may electrically insulate and isolate the through via 250 from the upper substrate 210. The via isolation pattern 230e may extend in the first direction D1. The via isolation pattern 230e may be materially continuous with a capping insulating layer 240.

Referring to FIG. 13, a semiconductor device 10f may include a connection pad 260f. The connection pad 260f may be provided on a through via 250. For example, a pad conductive layer 266 may be provided on an upper surface of an upper substrate 210. The connection pad 260f may be provided on the pad conductive layer 266. The connection pad 260f may not be located in the upper substrate 210 or in a trench but may be provided on the upper surface of the upper substrate 210. A portion of the connection pad 260f may extend to the inside of the through via 250. In one embodiment, a via core 254 may cover part of the extending portion of the connection pad 260f.

Figure 14:
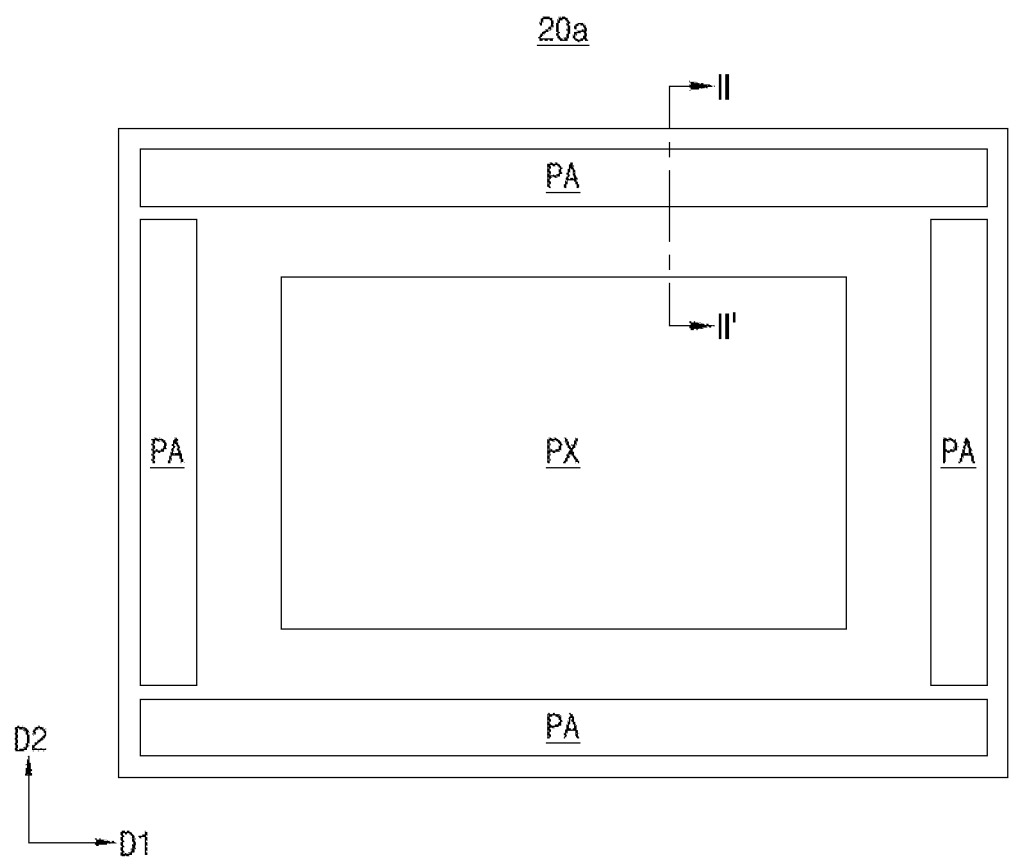
FIG. 14 is a plan view of a semiconductor device according to an embodiment of the inventive concept.
Figure 15:
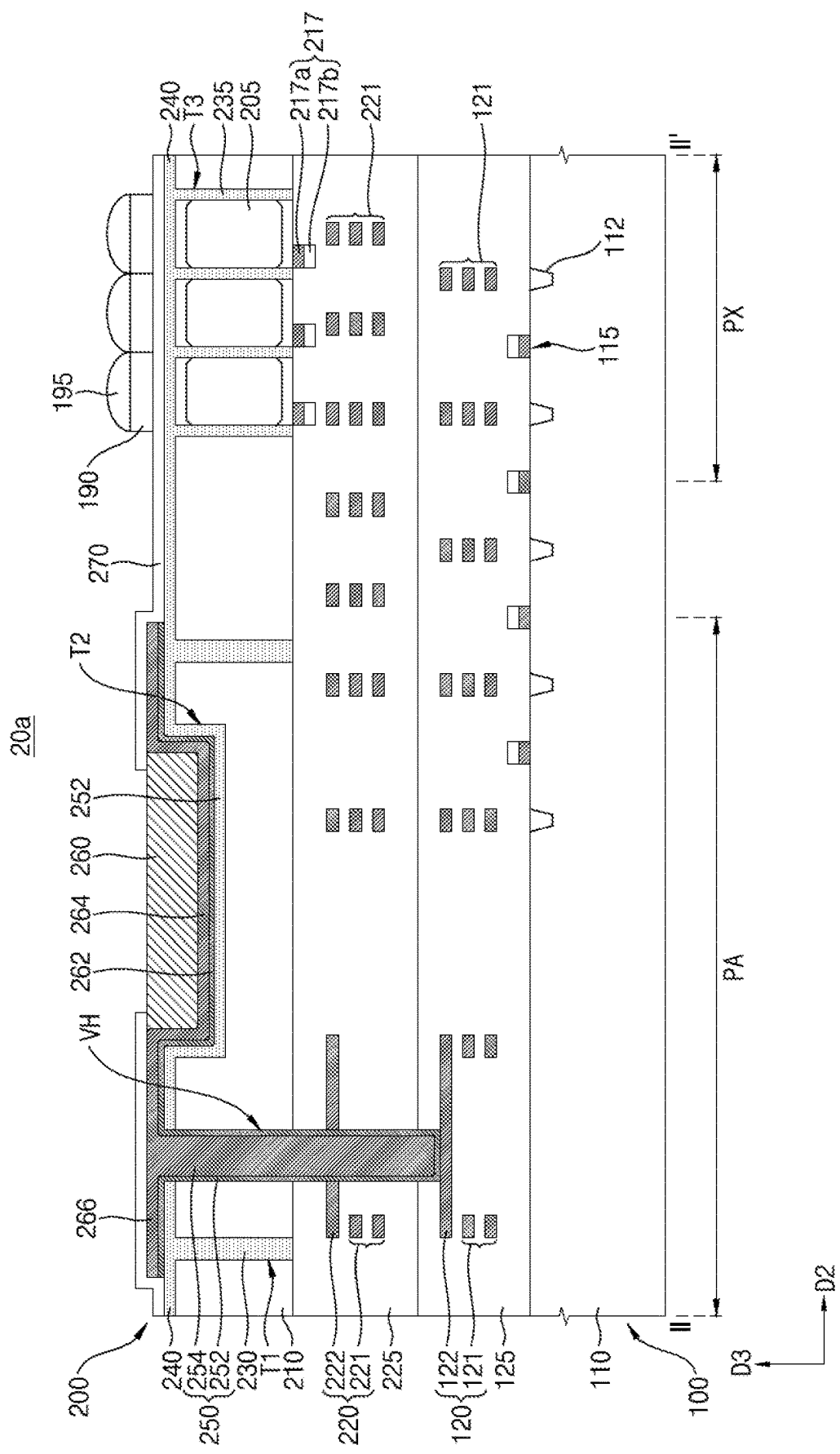
FIG. 15 is a vertical cross-sectional view of the semiconductor device of FIG. 14, taken along line II-II'.

FIG. 14 is a plan view of a semiconductor device according to an embodiment of the inventive concept. FIG. 15 is a vertical cross-sectional view of the semiconductor device of FIG. 14, taken along line II-II'. The semiconductor device of FIGS. 14 and 15 may be a back side illumination image sensor.

Referring to FIG. 14, a semiconductor device 20a may include a pixel area PX and a pad area PA when viewed from a top view. The pixel area PX may be located at a central portion of the semiconductor device 20a. The pixel area PX may include a pixel array which generates an image signal when light is incident thereon. Although not shown, the pixel area PX may further include an optical black region. The pad area PA may be located at a peripheral portion of the semiconductor device 20a. The pad area PA may surround the pixel area PX but is not limited thereto. The pad area PA may be connected to an external terminal (not shown) to transmit a signal to or receive a signal from the external terminal.

Referring to FIG. 15, the semiconductor device 20a may include a lower element 100, a lower substrate 110, a lower circuit 120, an upper element 200, an upper substrate 210, an upper circuit 220, a pad isolation pattern 230, a capping insulating layer 240, a through via 250, and a connection pad 260. The semiconductor device 20a may further include a color filter 190, a microlens 195, a photodiode 205, and a pixel isolation layer 235.

The lower element 100 may include the lower substrate 110, the lower circuit 120, and a lower interlayer insulating layer 125. The lower element 100 may further include a lower isolation region 112 and a lower gate 115. The lower isolation region 112 may be included in the lower substrate 110 and may include an insulating material such as silicon oxide. The lower gate 115 may be provided on the lower substrate 110, and the lower interlayer insulating layer 125 may cover the lower gate 115. The lower gate 115 may include a gate electrode and a gate capping layer. The gate electrode may include a conductive material, and the gate capping layer may include an insulating material such as silicon nitride. The lower gate 115 may be electrically connected to a lower interconnection 121 and a lower via pad 122 of the lower circuit 120.

The upper element 200 may be provided on the lower element 100. For example, the upper element 200 may be stacked on and bonded to the lower element 100. The upper element 200 may include the upper substrate 210, the upper circuit 220, the upper interlayer insulating layer 225, the pad isolation pattern 230, the capping insulating layer 240, the through via 250, and the connection pad 260 which are located in the pad area PA. The upper element 200 may further include the color filter 190, the microlens 195, the photodiode 205, a transmission gate structure 217, and the pixel isolation layer 235 which are located in the pixel area PX.

The color filter 190 may be provided on the upper substrate 210. For example, the color filter 190 may be provided on a passivation layer 270. The color filter 190 may be a Bayer pattern having a red filter R, a green filter R, or a blue filter B for each unit pixel. In one embodiment, the color filter 190 may include a cyan filter, a magenta filter, or a yellow filter. The color filter 190 may further include a white filter. The microlens 195 may be provided on the color filter 190.

The photodiode 205 may be provided in the upper substrate 210. The photodiode 205 may be provided below the color filter 190. The photodiode 205 may include an impurity region. The transmission gate structure 217 may be provided in the upper interlayer insulating layer 225. The transmission gate structure 217 may include a transmission gate electrode 217a and a transmission gate capping layer 217b and be located close to the photodiode 205. The transmission gate structure 217 may be electrically connected to an upper interconnection 221 of the upper circuit 220. The pixel isolation layer 235 may be formed in a third trench T3. The pixel isolation layer 235 may be provided between photodiodes 205. The pixel isolation layer 235 may include the same material as the capping insulating layer 240 and be materially continuous with the capping insulating layer 240.

Figure 16:
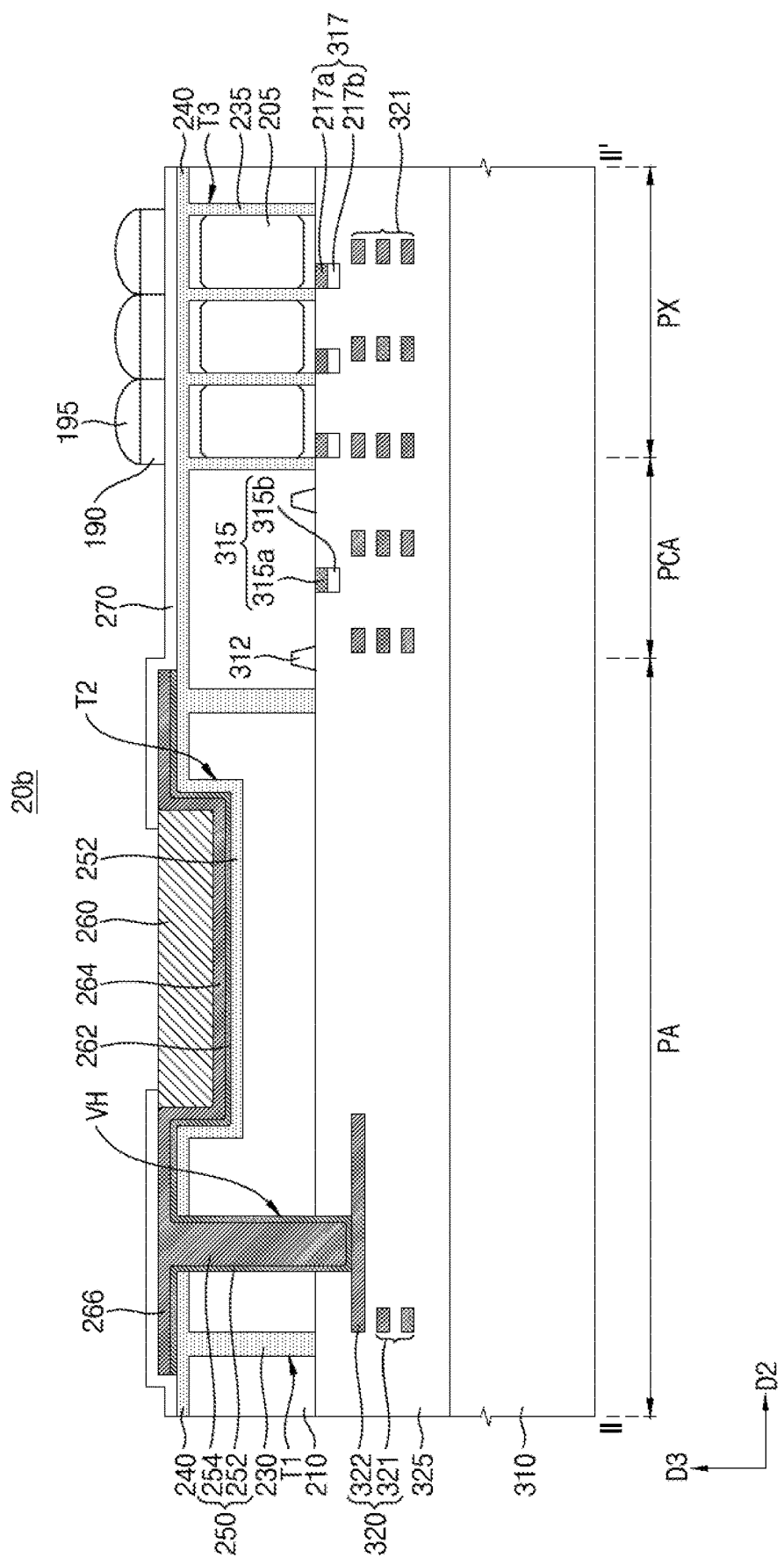
FIG. 16 is a cross-sectional view of a semiconductor device according to an embodiment of the inventive concept.

FIG. 16 is a cross-sectional view of a semiconductor device according to an embodiment of the inventive concept.

Referring to FIG. 16, a semiconductor device 20b may include a peripheral circuit area PCA between a pad area PA and a pixel area PX. The semiconductor device 20b may include a support substrate 310, a circuit 320, and an interlayer insulating layer 325. The support substrate 310 may be provided below the interlayer insulating, layer 325 and support the semiconductor device 20b. The circuit 320 may be provided in the interlayer insulating layer 325 and include an interconnection 321 and a via pad 322.

The semiconductor device 20b may include a pad isolation pattern 230, a capping insulating layer 240, a through via 250, and a connection pad 260 which are located in the pad area PA. The semiconductor device 20b may include an isolation region 312 and a gate structure 315 which are located in the peripheral circuit area PCA. The isolation region 312 may include an insulating material such as silicon oxide. The gate structure 315 may be provided in the interlayer insulating layer 325. The gate structure 315 may include a gate electrode 315a and a gate capping layer 315b. The gate structure 315 may be electrically connected to the circuit 320 included in the interlayer insulating layer 325.

According to the example embodiments of the inventive concept, a pad isolation pattern surrounding the connection pad 260 includes a plurality of bent portions to prevent cracks from occurring in a semiconductor device.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
   a substrate;
   an interlayer insulating layer below the substrate and including a via pad;
   a through via located at least partially within a via hole passing through the substrate and a portion of the interlayer insulating layer and connected to the via pad;
   a connection pad on the substrate and electrically connected to the through via; and
   a pad isolation pattern formed in the substrate, around the connection pad and the through via,
   wherein the pad isolation pattern includes a plurality of bent portions having protrusions and recesses in a top view.

2. The semiconductor device of claim 1, wherein a distance from the connection pad to one of the recesses adjacent thereto in a first direction is less than a distance from the connection pad to one of the protrusions adjacent thereto in the first direction.

3. The semiconductor device of claim 1, wherein the pad isolation pattern is provided to surround the connection pad and the through via.

4. The semiconductor device of claim 1, wherein each of the protrusions and the recesses has an angular concave-convex shape in the top view.

5. The semiconductor device of claim 1, wherein each of the recesses has a round shape in the top view.

6. The semiconductor device of claim 1, wherein the substrate comprises a trench in an upper portion thereof, and the connection pad is spaced apart from the through via in a first direction and is provided in the trench.

7. The semiconductor device of claim 1, further comprising a pad conductive layer provided on the substrate and connecting the through via and the connection pad.

8. The semiconductor device of claim 7, wherein an outer circumference of the pad conductive layer is located inside the pad isolation pattern.

9. The semiconductor device of claim 7, wherein an outer circumference of the pad conductive layer is located outside the pad isolation pattern.

10. The semiconductor device of claim 9, further comprising an outer isolation pattern located outside the pad conductive layer and comprising an outer plurality of bent portions.

11. The semiconductor device of claim 1, further comprising a via isolation pattern provided in the substrate and between the through via and the connection pad.

12. The semiconductor device of claim 1, wherein the connection pad is provided on the through via.

13. The semiconductor device of claim 1, further comprising a lower substrate below the interlayer insulating layer.

14. A semiconductor device comprising:
a first connection pad and a second connection pad;
first through vias located adjacent to the first connection pad and second through vias located adjacent to the second connection pad;
a first pad isolation pattern surrounding the first connection pad and the first through vias in a frame shape; and
a second pad isolation pattern surrounding the second connection pad and the second through vias in the frame shape,
wherein, in a top view, the first pad isolation pattern comprises a plurality of first bent portions having protrusions and recesses and the second pad isolation pattern comprises a plurality of second bent portions having protrusions and recesses.

15. The semiconductor device of claim 14, wherein a distance between the protrusions of the first bent portions and the protrusions of the second bent portions which face each other in a first direction is a first width, and
a distance between the recesses of the first bent portions and the recesses of the second bent portions which face each other in the first direction is a second width greater than the first width.

16. The semiconductor device of claim 14, further comprising:
a first pad conductive layer covering the first pad isolation pattern; and
a second pad conductive layer covering the second pad isolation pattern.

17. The semiconductor device of claim 16, further comprising a capping insulating layer covering at least portions of the first pad conductive layer and the second pad conductive layer.

18. The semiconductor device of claim 14, wherein the first through via is spaced apart from the first connection pad in a horizontal direction, and
the second through via is spaced apart from the second connection pad in the horizontal direction.

19. A semiconductor device comprising:
a lower substrate;
a lower interlayer insulating layer provided on the lower substrate and comprising a lower via pad therein;
an upper interlayer insulating layer provided on the lower interlayer insulating layer and comprising an upper via pad therein;
an upper substrate on the upper interlayer insulating layer;
a through via located at least partially within a via hole passing through the upper substrate and a portion of the upper interlayer insulating layer and connected to the lower via pad;
a connection pad provided in a trench formed in an upper portion of the upper substrate and electrically connected to the through via;
a pad isolation pattern passing through the upper substrate and surrounding the connection pad and the through via;
a photodiode provided in the upper substrate;
a color filter provided on the photodiode; and
a microlens provided on the color filter,
wherein the pad isolation pattern comprises a plurality of bent portions having protrusions and recesses in a top view.

20. The semiconductor device of claim 19, wherein a distance from the connection pad to a recess adjacent thereto in a first direction is less than a distance from the connection pad to a protrusion adjacent thereto in the first direction.

21. A semiconductor device comprising:
a substrate;
an interlayer insulating layer below the substrate in a vertical direction;
a plurality of via pads located within the interlayer insulating layer;
a plurality of through vias, wherein each of the through vias is connected to one of the plurality of via pads and at least a portion of each of the through vias is located in a via hole passing through at least a portion of the interlayer insulating layer;
a connection pad on the substrate and electrically connected to the through vias; and
a pad isolation pattern formed in the substrate, wherein the pad isolation pattern surrounds the connection pad on four sides in a horizontal plane perpendicular to the vertical direction, and wherein the pad isolation pattern comprises a plurality of bent portions forming a plurality of protrusions and recesses in the horizontal plane on at least one of the four sides.

* * * * *